United States Patent
Krishnamurthy et al.

(10) Patent No.: US 6,740,469 B2
(45) Date of Patent: May 25, 2004

(54) DEVELOPER-SOLUBLE METAL ALKOXIDE COATINGS FOR MICROELECTRONIC APPLICATIONS

(75) Inventors: Vandana Krishnamurthy, Rolla, MO (US); Charles J. Neef, Rolla, MO (US); Juliet A. M. Snook, Cook Station, MO (US)

(73) Assignee: Brewer Science Inc., Rolla, MO (US)

( * ) Notice: Subject to any disclaimer, the term of this patent is extended or adjusted under 35 U.S.C. 154(b) by 36 days.

(21) Appl. No.: 10/180,625

(22) Filed: Jun. 25, 2002

(65) Prior Publication Data

US 2003/0235786 A1 Dec. 25, 2003

(51) Int. Cl.$^7$ .................. G03C 1/735; G03C 1/825; G03F 7/20; G03F 7/30; G03F 7/09
(52) U.S. Cl. .................. 430/270.1; 430/905; 430/950; 430/910; 430/909; 430/280.1; 430/271.1; 430/272.1; 430/325; 430/326; 430/331; 430/311; 430/510; 430/514; 430/330; 524/610; 524/502; 524/500; 524/503; 525/389; 525/474; 525/476; 525/479; 523/221; 523/400; 523/435
(58) Field of Search .................. 430/270.1, 905, 430/909, 910, 271.1, 272.1, 311, 313, 325, 326, 330, 331, 280.1, 510, 514, 950; 524/610, 502, 500, 503; 523/221, 400, 435; 525/389, 474, 476, 479

(56) References Cited

U.S. PATENT DOCUMENTS

| | | | |
|---|---|---|---|
| 4,244,799 A | 1/1981 | Fraser et al. | 204/192 E |
| 4,369,090 A * | 1/1983 | Wilson et al. | 156/644 |
| 4,683,024 A | 7/1987 | Miller et al. | 156/643 |
| 4,732,841 A | 3/1988 | Radigan | 430/311 |
| 4,738,916 A | 4/1988 | Namatsu et al. | 430/272.1 |
| 4,891,303 A | 1/1990 | Garza et al. | 430/312 |
| 4,910,122 A * | 3/1990 | Arnold et al. | 430/313 |
| 5,126,231 A | 6/1992 | Levy | 430/313 |
| 5,370,969 A | 12/1994 | Vidusek | 430/272.1 |
| 5,403,438 A | 4/1995 | Motoyama | 156/660 |
| 5,632,910 A | 5/1997 | Nagayama et al. | 216/47 |
| 5,925,578 A | 7/1999 | Bae | 438/736 |
| 6,015,650 A | 1/2000 | Bae | 430/314 |
| 6,136,511 A | 10/2000 | Reinberg et al. | 430/313 |
| 6,156,665 A | 12/2000 | Hamm et al. | 438/706 |
| 6,309,789 B1 * | 10/2001 | Takano et al. | 430/270.1 |
| 6,380,611 B1 | 4/2002 | Yin et al. | 257/649 |

FOREIGN PATENT DOCUMENTS

JP      10149531    *   6/1998

OTHER PUBLICATIONS

Machine Assisted English translation for JP–10149531.*

* cited by examiner

*Primary Examiner*—Mark F. Huff
*Assistant Examiner*—Sin J. Lee
(74) *Attorney, Agent, or Firm*—Hovey Williams LLP

(57) ABSTRACT

Anti-reflective compositions and methods of using these compositions to form circuits are provided. The compositions comprise a polymer dissolved or dispersed in a solvent system. In a preferred embodiment, the polymers of the composition include recurring units having the formula $$\begin{array}{c} R \diagdown \diagup R \\ \diagdown \diagup \\ O \quad O \\ \diagdown M-O \diagup, \\ | \\ X \end{array}$$

where X is a light-attenuating moiety, M is a metal, and each R is individually selected from the group consisting of hydrogen, alkyls, aryls, alkoxys, and phenoxys. The resulting compositions are spin bowl compatible (i.e., they do not crosslink prior to the bake stages of the microlithographic processes or during storage at room temperature), are wet developable, and have superior optical properties.

61 Claims, 1 Drawing Sheet

DEVELOPER-SOLUBLE METAL ALKOXIDE COATINGS FOR MICROELECTRONIC APPLICATIONS

This invention was made with Government support under contract DASG60-02-P-0201 awarded by the United States Army Space and Missile Defense Command. The Government has certain rights in the invention.

BACKGROUND OF THE INVENTION

1. Field of the Invention

The present invention is concerned with new anti-reflective compositions for use in the manufacture of microelectronic devices. These compositions include polymeric metal alkoxides and are developable in aqueous photoresist developers.

2. Description of the Prior Art

Integrated circuit manufacturers are consistently seeking to maximize substrate wafer sizes and minimize device feature dimensions in order to improve yield, reduce unit case, and increase on-chip computing power. Device feature sizes on silicon or other chips are now submicron in size with the advent of advanced deep ultraviolet (DUV) microlithographic processes.

However, a frequent problem encountered by photoresists during the manufacturing of semiconductor devices is that activating radiation is reflected back into the photoresist by the substrate on which it is supported. Such reflectivity tends to cause blurred patterns which degrade the resolution of the photoresist. Degradation of the image in the processed photoresist is particularly problematic when the substrate is non-planar and/or highly reflective. One approach to address this problem is the use of an anti-reflective coating applied to the substrate beneath the photoresist layer. While anti-reflective coatings are effective at preventing or minimizing reflection, their use requires an additional break-through step in the process in order to remove the coatings. This necessarily results in an increased process cost.

One solution to this problem has been the use of wet developable anti-reflective coatings. These types of coating can be removed along with the exposed areas of the photoresist material. That is, after the photoresist layer is exposed to light through a patterned mask, the exposed areas of the photoresist are wet developable and are subsequently removed with an aqueous developer to leave behind the desired trench and hole pattern. Wet developable anti-reflective coatings are removed during this developing step, thus eliminating the need for an additional removal step. Unfortunately, wet developable anti-reflective coatings have not seen widespread use due to the fact that they must also exhibit good spin bowl compatibility and superior optical properties to be useful as an anti-reflective coating. Thus, there is a need for anti-reflective coating compositions which are developable in conventional photoresist developers while simultaneously exhibiting good coating and optical properties.

SUMMARY OF THE INVENTION

The present invention broadly comprises new microlithographic compositions that are useful in the manufacture of microelectronic devices.

In more detail, the compositions comprise a polymer dispersed or dissolved in a solvent system. Preferred polymers include recurring units having the formula

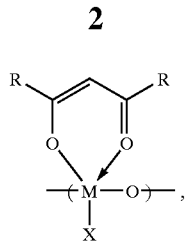

wherein X is a light-attenuating moiety, M is a metal, and each R is individually selected from the group consisting of hydrogen, alkyls (preferably $C_1$–$C_8$), aryls, alkoxys, and phenoxys. The most preferred R groups are —$CH_3$ and —$OC_2H_5$.

The polymer preferably further comprises recurring units having the formula

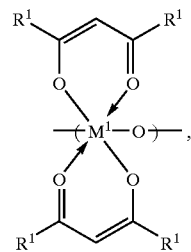

where each $R^1$ is individually selected from the group consisting of hydrogen, alkyls (preferably $C_1$–$C_8$), aryls, alkoxys, and phenoxys, and $M^1$ is a metal. The most preferred $R^1$ groups are —$CH_3$ and —$OC_2H_5$.

With either of the foregoing recurring units, the most preferred metals are Ti, Zr, Si, and/or Al. It is also preferred that the light-attenuating moiety include a functional group for coordinating with the metal atom of the polymeric metal alkoxide. Such functional groups include carbonyl, alcohol, and phenol groups. Furthermore, the moiety (i.e., X) is preferably present in the polymer at a level of from about 5–50% by weight, and more preferably from about 10–25% by weight, based upon the total weight of the polymer taken as 100% by weight. Suitable light-attenuating moieties include those selected from the group consisting of moieties of trimethylol ethoxylate, 4-hydroxybenzaldehyde, and 2-cyano-3-(4-hydroxyphenyl)-acrylic acid ethyl ester. Also, in order to avoid photosensitivity in the composition, none of X, R, and $R^1$ should include any ethylenically unsaturated groups.

In another embodiment, the polymer is formed by reacting a polymeric metal alkoxide with an organic compound. The polymeric metal alkoxide includes recurring units having the formula (I)

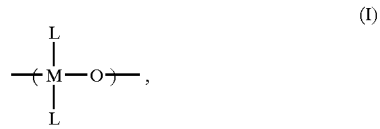

where M is a metal, and each L is individually selected from the group consisting of diketo and alkoxide ligands. Preferred L groups have the formula

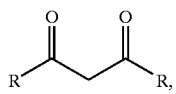

where each R is individually selected from the group consisting of hydrogen, alkyls (preferably $C_1$–$C_8$), aryls, alkoxys, and phenoxys, with —$CH_3$ and —$OC_2H_5$ being the most preferred R groups. A moiety of ethyl acetoacetate is the most preferred L group. The preferred metal atoms are the same as those discussed previously.

In this embodiment, the polymeric metal alkoxide having the structure of Formula I above can first be formed by reacting a polymeric metal alkoxide (e.g., poly(dibutyltitanate)) with a diketo or alkoxide ligand (e.g., ethyl acetoacetate). Alternately, a starting monomer which already includes the diketo or alkoxide ligand as part of its structure can be formed into the desired polymer by hydrolyzing and then condensing the monomer. One example of this type of starting monomer is titanium diisopropoxide bis(ethylacetoacetate).

The organic compound which is reacted with the polymeric metal alkoxide having the structure of Formula I above should comprise a functional group suitable for coordinating with the metal atom of the polymeric metal alkoxide. Suitable functional groups include alcohols, phenols, thioalcohols, thiophenols, and carbonyls. The most preferred organic compounds are trimethylol ethoxylate, 4-hydroxybenzaldehyde, and 2-cyano-3-(4-hydroxyphenyl)-acrylic acid ethyl ester.

Regardless of the embodiment, the anti-reflective compositions are formed by simply dispersing or dissolving the polymers in a suitable solvent system, preferably at ambient conditions and for a sufficient amount of time to form a substantially homogeneous dispersion. The polymer should be present in the composition at a level of 2–50% by weight, more preferably from about 5–30% by weight, and more preferably from about 7–15% by weight, based upon the total weight of solids in the composition taken as 100% by weight. The viscosity of this polymer is preferably from about 2,000–5,000 cS, and more preferably from about 3,200–3,500 cS.

Preferred solvent systems include a solvent selected from the group consisting of propylene glycol methyl ether acetate (PGMEA), propylene glycol methyl ether (PGME), propylene glycol n-propyl ether (PnP), ethyl lactate, and mixtures thereof. Preferably, the solvent system has a boiling point of from about 50–250° C., and more preferably from about 100–175° C. The solvent system should be utilized at a level of from about 70–95% by weight, and preferably from about 80–90% by weight, based upon the total weight of the solids in the composition taken as 100% by weight.

Any additional ingredients are also preferably dispersed in the solvent system along with the polymer. One such preferred additional ingredient is a second polymer or polymer binder such as those selected from the group consisting of epoxy novolac resins (e.g., Epon 164®, available from Araldite), acrylates (e.g., poly(glycidyl methacrylate)), polymerized aminoplasts (e.g., Cymel® products available from Cytec Industries), glycourals (e.g., Powderlink® products available from Cytec Industries), vinyl ethers, and mixtures thereof. The weight average molecular weight of this additional polymer is preferably from about 1,000–50,000 Daltons, and more preferably from about 5,000–25,000 Daltons. In embodiments where an additional polymer is utilized, the composition should comprise from about 1–50% by weight of this additional polymer, and more preferably from about 5–25% by weight, based upon the total weight of the solids in the composition taken as 100% by weight.

It will be appreciated that a number of other optional ingredients can be included in the composition as well. Typical optional ingredients include light attenuating compounds, surfactants, catalyst, crosslinkers, and adhesion promoters.

The method of applying the fill or anti-reflective coating compositions to a substrate simply comprises applying a quantity of a composition hereof to the substrate surface by any known application method (including spin-coating). The substrate can be any conventional chip (e.g., silicon wafer), an ion implant layer, etc.

After the desired coverage is achieved, the resulting layer should be heated to a temperature of from about 100–250° C. to induce crosslinking. This will result in the evaporation of the solvent system as well as the volatilization of at least a portion of the organic constituents of the composition to yield a cured layer having alternating metal and oxygen atoms. The refractive index of this cured anti-reflective layer or coating will be at least about 1.4, preferably from about 1.5–2.0, and more preferably from about 1.6–1.7 at a wavelength of about 365 nm.

When used on topographical substrates, the thickness of the cured layer on the surface of the substrate adjacent the edge of a contact or via hole should be at least about 60%, preferably at least about 75%, and more preferably at least about 85% of the thickness of the film on the substrate surface a distance away from the edge of the contact or via hole approximately equal to the diameter of the hole.

A photoresist can be applied to the cured material, followed by exposing, developing, and etching of the photoresist. Following the methods of the invention will yield precursor structures for dual damascene and other microlithographic processes which have the foregoing desirable properties.

It will further be appreciated that the cured inventive compositions are wet developable. That is, the cured compositions can be removed with conventional aqueous developers such as tetramethyl ammonium hydroxide and KOH developers. Some of these developers are commercialized under the tradenames MF-319 (available from Shipley, Mass.), MF-320 (available from Shipley), and NMD3 (available from TOK, Japan) developers. At least about 95%, and preferably at least about 99% of the inventive coatings will be removed by a base developer such as tetramethyl ammonium hydroxide and KOH developers. This percent solubility in commercially-available developers is a significant advantage over the prior art as this shortens the manufacturing process and makes it less costly.

Finally, in addition to the many advantages described above, the present composition is spin bowl compatible. This is determined by coating a four-inch sample wafer with the composition. After coating, the wafer is not baked, but is instead positioned upward in order to prevent film flow. The sample is allowed to dry for about 24 hours in a cleanroom to yield a film around 1200–1300 Å thick. The sample thickness is then measured at five locations to determine the average initial sample thickness.

The coated wafer is exposed to the particular test solvent (e.g., propylene glycol methyl ether acetate). This is accomplished by flooding the sample surface with the solvent for three minutes (±five seconds) followed by spinning for 15 seconds at 1,500 rpm (20,000 rpm Ramp) and then for 30 seconds at 2500 rpm (20,000 rpm Ramp). The thickness of the sample is again measured at five locations, and the average final sample thickness is determined.

The percent solubility is calculated as follows:

$$\% \text{ solubility} = \left[ \frac{\text{(ave. initial sample thickness} - \text{ave. final sample thickness)}}{\text{(initial sample thickness)}} \right] * 100.$$

The inventive compositions yield a percent solubility of at least about 75%, and more preferably at least about 90%.

DETAILED DESCRIPTION OF THE PREFERRED EMBODIMENTS

The inventive composition is particularly advantageous because the above-described process avoids degradation and erosion of the contact or via hole and trench sidewalls and bottom wall. That is, with prior art compositions the sidewalls typically erode during the removal of the anti-reflective coating layers so that the sidewalls are no longer straight and upright. This often results in defects in the circuit.

Figure 1A:
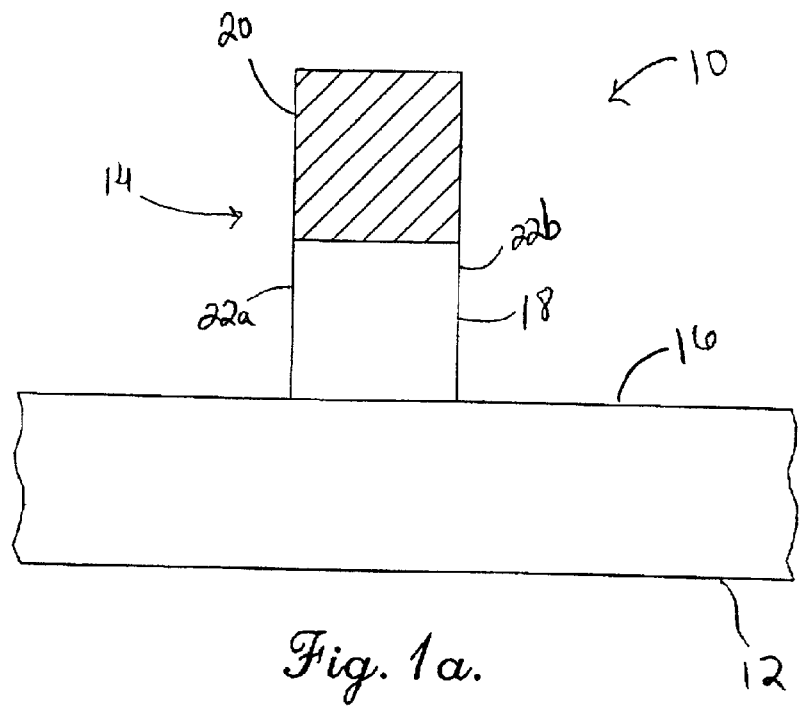
FIG. 1a schematically depicts a circuit precursor structure having a line feature with vertical sidewalls.

FIG. 1a depicts a portion of a starting circuit structure 10. Circuit structure 10 includes a substrate 12 and a line feature 14. Substrate 12 has an upper surface 16. Line feature 14 comprises an anti-reflective layer 18 and a photoresist layer 20. As illustrated in the figure, anti-reflective layer 18 has sidewalls 22a,b which are substantially vertical as preferred.

Figure 1B:
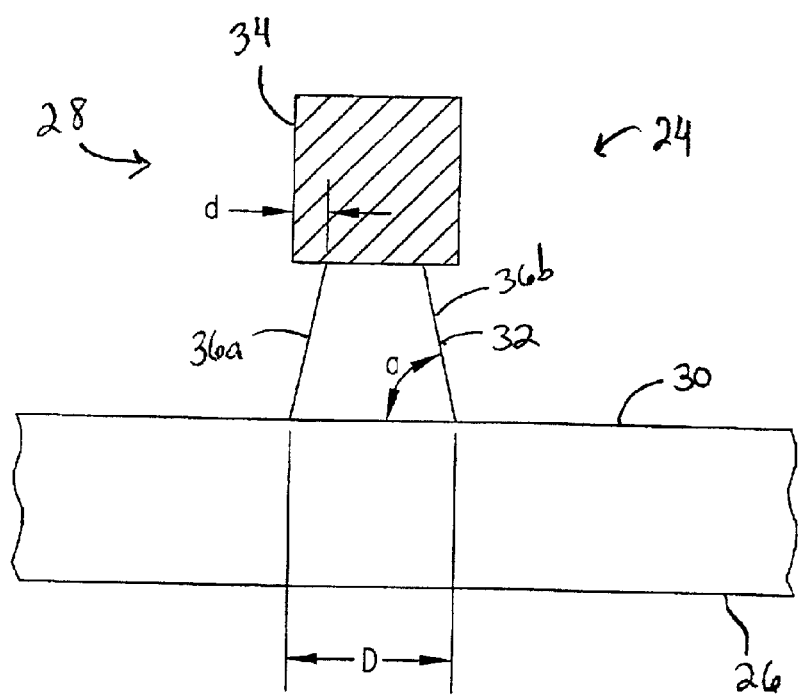
FIG. 1b is a schematic illustration similar to FIG. 1a but depicting a line feature having eroded sidewalls.

FIG. 1b depicts a portion of a second starting structure 24. Circuit structure 24 also includes a substrate 26 and a line feature 28. Substrate 26 has an upper surface 30 while line feature 28 comprises an anti-reflective layer 32 and a photoresist layer 34. Anti-reflective layer 32 has sidewalls 36a,b. Unlike the sidewalls 22a,b of circuit structure 10 in FIG. 1a, the sidewalls 36a,b have suffered from degradation and erosion during further processing steps (e.g., during wet developing). This is highly undesirable as it can lead to defects. The present invention has the distinct advantage of minimizing or avoiding this degradation and erosion. Specifically, angle "a" of a line feature formed according to the invention is from about 83–90° and preferably from about 87–90°. As used herein, angle "a" is the smallest angle formed by sidewall 36a and upper surface 30 or sidewall 36b and upper surface 30 (see FIG. 1b).

Furthermore, the percent erosion of a line feature formed according to the present invention is less than about 15%, more preferably less than about 10%, and even more preferably less than about 7%. As used herein, percent erosion is defined as:

$$\frac{d}{D} * 100 = \% \text{ erosion,}$$

where "d" and "D" are as shown in FIG. 1b.

EXAMPLES

The following examples set forth preferred methods in accordance with the invention. It is to be understood, however, that these examples are provided by way of illustration and nothing therein should be taken as a limitation upon the overall scope of the invention.

Example 1

In this example, a formulation was prepared by dissolving 15.0 g of poly(dibutyltitanate) in 15.0 g of propylene glycol monomethyl ether (PGME). Next, a solution of 19.52 g of ethyl acetoacetate dissolved in 15.0 g of PGME was added to the reaction mixture followed by stirring for four hours. A solution of trimethylolethoxylate was added to the mixture, and the mixture was stirred for one hour. The resulting formulation was then filtered through a 0.1 $\mu$m PTFE filter prior to use. The composition was spin-coated onto a silicon wafer at 3000 rpm and subjected to a two-stage bake process at 130° C. for 30 seconds followed by 168° C. or 205° C. for 60 seconds. Both examples exhibited solubility in base developer.

Example 2

In this example, a formulation was prepared by dissolving 5.0 g of poly(dibutyltitanate) in 20.0 g of PnP. Next, a solution of 6.5 g of ethyl acetoacetate dissolved in 18.5 g of PGME was added to the reaction mixture followed by stirring for four hours. Cymel® (an aminoplast crosslinking agent available from Cytec Industries) and 2-cyano-3-(4-hydroxyphenyl)-acrylic acid ethyl ester (CHAE) were added to the mixture, and the mixture was stirred for one hour. The formulation was diluted with 47.5 g of PnP and filtered through a 0.1 $\mu$m PTFE filter prior to use. The composition was spin-coated onto a silicon wafer at 3000 rpm and subjected to a two-stage bake process at 130° C. for 30 seconds followed by baking at a temperature ranging from 168–205° C. for 60 seconds. All examples exhibited solubility in base developer.

Example 3

A mother liquor was prepared by dissolving 16.67 g of zirconium di-n-butoxide(bis-2,4-pentanedionate) (60% in butanol) in 99.59 g of PnP. Next, 0.41 g of water was added to the solution followed by stirring for 24 hours to yield the mother liquor.

The anti-reflective coating formulation was prepared by mixing 11.67 g of the mother liquor with 0.25 g of CHAE followed by stirring for one hour. The formulation was then filtered through a 0.1 $\mu$m PTFE filter, and the composition was spin-coated onto a wafer at 3000 rpm and baked at 168° C. for 60 seconds. The sample exhibited solubility in the base developer.

Example 4

A mother liquor was prepared by dissolving 10.00 g of titanium diisoproxibe bis(ethylacetoacetate) and 1.23 g of tetraorthosilicate in 112.30 g of PnP. Next, 0.64 g of water was added to the solution followed by stirring for 24 hours to yield the mother liquor.

The anti-reflective coating formulation was prepared by mixing 20.00 g of the mother liquor with 0.25 g of vanillin followed by stirring for four hours. The formulation was then filtered through a 0.1 $\mu$m PTFE filter, and the composition was spin-coated onto a wafer at 3000 rpm and baked at 168° C. for 60 seconds. The sample exhibited solubility in the base developer.

Example 5

Determination of Properties

1. Optical Properties

The respective refractive indexes for the formulations from Examples 2–4 are set forth in Table A.

TABLE A

| Example # | Refractive Index |
|---|---|
| 2 | 1.99 |
| 3 | 1.68 |
| 4 | 1.75 |

2. Spin Bowl Compatibility

Films prepared from the composition of Example 2 were tested for their spin bowl compatibility following the procedure described previously. Compositions were considered to be spin bowl compatible if they had a percent solubility of at least about 90%. The results of these tests are set forth in Table B. Table B

TABLE B

| Example No. | Solvent | Thickness before strip, Å | Thickness after strip, Å | % solubility | Spin Bowl Compatible |
|---|---|---|---|---|---|
| 2 | PGMEA[a] | 1273 | 31 | 97.56 | yes |
| 2 | Ethyl lactate | 1277 | 21 | 98.35 | yes |
| 2 | Heptanone | 1276 | 48 | 96.24 | yes |

[a]propylene glycol methyl ether acetate.

We claim:

1. A composition for use in photolithographic processes, said composition comprising:
   a solvent system; and
   a polymer dispersed or dissolved in said solvent system, said polymer including recurring units having the formula

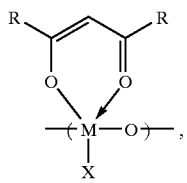

wherein X is a light-attenuating moiety, M is a metal, and each R is individually selected from the group consisting of hydrogen, alkyls, aryls, alkoxys, and phenoxys.

2. The composition of claim 1, said polymer further comprising recurring units having the formula

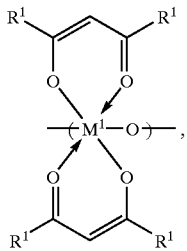

wherein each $R^1$ is individually selected from the group consisting of hydrogen, alkyls, aryls, alkoxys, and phenoxys, and $M^1$ is a metal.

3. The composition of claim 1, wherein M in each recurring unit is a metal individually selected from the group consisting of Ti, Zr, Si, and Al.

4. The composition of claim 1, wherein said composition further comprises a polymer binder.

5. The composition of claim 4, wherein said polymer binder is selected from the group consisting of epoxy novolac resins, acrylates, polymerized aminoplasts, glycourals, vinyl ethers, and mixtures thereof.

6. The composition of claim 4, wherein said polymer binder has a molecular weight of from about 1,000 to about 50,000.

7. The composition of claim 1, wherein X includes a functional group for coordinating with M.

8. The composition of claim 7, wherein said functional group is selected from the group consisting of carbonyls, alcohols, and phenols.

9. The composition of claim 1, wherein X is selected from the group consisting of functional moieties of trimethylol ethoxylate, 4-hydroxybenzaldehyde, and 2-cyano-3-(4-hydroxyphenyl)-acrylic acid ethyl ester.

10. The composition of claim 1, wherein each X and R do not include any ethylenically unsaturated groups.

11. The composition of claim 1, wherein one R is —CH$_3$ and the other R is —OC$_2$H$_5$.

12. A composition for use in photolithographic processes, said composition comprising:
    a solvent system; and
    a polymer dispersed or dissolved in said solvent system, said polymer being formed by reacting a polymeric metal alkoxide with an organic compound, said polymeric metal alkoxide including recurring units having the formula

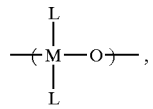

wherein M is a metal, and each L is individually selected from the group consisting of diketo and alkoxide ligands; and
   said organic compound comprising a functional group for coordinating with M of said polymeric metal alkoxide.

13. The composition of claim 12, wherein M in each recurring unit is a metal individually selected from the group consisting of Ti, Zr, Si, and Al.

14. The composition of claim 12, wherein said composition further comprises a polymer binder.

15. The composition of claim 14, wherein said polymer binder is selected from the group consisting of epoxy novolac resins, acrylates, polymerized aminoplasts, glycourals, vinyl ethers, and mixtures thereof.

16. The composition of claim 14, wherein said polymer binder has a molecular weight of from about 1,000 to about 50,000.

17. The composition of claim 12, wherein each L individually has the formula

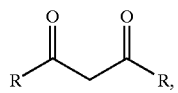

wherein each R is individually selected from the group consisting of hydrogen, alkyls, aryls, alkoxys, and phenoxys.

18. The composition of claim 17, wherein at least one L is a moiety of ethyl acetoacetate.

19. The composition of claim 17, wherein one R is —$CH_3$ and the other R is —$OC_2H_5$.

20. The composition of claim 12, wherein said functional group is selected from the group consisting of alcohol, phenol, and carbonyl groups.

21. The composition of claim 12, wherein said organic compound is selected from the group consisting of trimethylol ethoxylate, 4-hydroxybenzaldehyde, and 2-cyano-3-(4-hydroxyphenyl)-acrylic acid ethyl ester.

22. The combination of:
a substrate having a surface; and
a cured layer for use as a barrier or anti-reflective layer in photolithographic processes, said cured layer being adjacent said surface and comprising alternating metal atom and oxygen atom bonds and having a refractive index of at least about 1.4, said cured layer being wet developable.

23. The combination of claim 22, wherein said cured layer has a percent solubility of at least about 75% when propylene glycol methyl ether acetate is the solvent.

24. The combination of claim 22, wherein said substrate is selected from the group consisting of silicon wafers and ion implant layers.

25. The combination of claim 22, said combination further comprising a photoresist layer adjacent said cured layer.

26. The combination of claim 22, wherein said metal atom is selected from the group consisting of Ti, Zr, Si, and Al.

27. The combination of claim 22, wherein said cured layer is formed from a composition comprising:
a solvent system; and
a polymer dispersed or dissolved in said solvent system, said polymer including recurring units having the formula

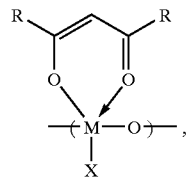

wherein X is a light-attenuating moiety, M is a metal, and each R is individually selected from the group consisting of hydrogen, alkyls, aryls, alkoxys, and phenoxys.

28. The combination of claim 22, wherein said cured layer is formed from a composition comprising:
a solvent system; and
a polymer dispersed or dissolved in said solvent system, said polymer being formed by reacting a polymeric metal alkoxide with an organic compound, said polymeric metal alkoxide including recurring units having the formula

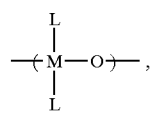

wherein M is a metal, and each L is individually selected from the group consisting of diketo and alkoxide ligands; and
said organic compound comprising a functional group for coordinating with M of said polymeric metal alkoxide.

29. The combination of claim 22, said cured layer being at least about 95% soluble in a base developer.

30. A method of using a composition in photolithographic processes, said method comprising the step of applying a quantity of a composition to a substrate to form a layer thereon, said composition comprising:
a solvent system; and
a polymer dispersed or dissolved in said solvent system, said polymer including recurring units having the formula

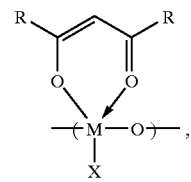

wherein X is a light-attenuating moiety, M is a metal, and each R is individually selected from the group consisting of hydrogen, alkyls, aryls, alkoxys, and phenoxys.

31. The method of claim 30, wherein said applying step comprises spin-coating said composition onto said substrate surface.

32. The method of claim 30, wherein said substrate has a hole formed therein, said hole being defined by a bottom wall and sidewalls, and said applying step comprises applying said composition to at least a portion of said bottom wall and sidewalls.

33. The method of claim 30, further including the step of baking said layer, after said applying step, at a temperature of from about 100–250° C. to yield a cured layer.

34. The method of claim 33, further including the step of applying a photoresist to said baked layer.

35. The method of claim 34, furthering including the steps of:
exposing at least a portion of said photoresist to activating radiation; and
developing said exposed photoresist.

36. The method of claim 35, wherein said developing step results in the removal of said composition from areas adjacent said exposed photoresist.

37. A method of using a composition in photolithographic processes, said method comprising the step of applying a quantity of a composition to a substrate to form a layer thereon, said composition comprising:
a solvent system; and
a polymer dispersed or dissolved in said solvent system, said polymer being formed by reacting a polymeric metal alkoxide with an organic compound, said polymeric metal alkoxide including recurring units having the formula

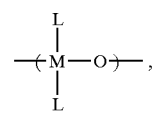

wherein M is a metal, and each L is individually selected from the group consisting of diketo and alkoxide ligands; and
said organic compound comprising a functional group for coordinating with M of said polymeric metal alkoxide.

38. The method of claim 37, wherein said applying step comprises spin-coating said composition onto said substrate surface.

39. The method of claim 37, wherein said substrate has a hole formed therein, said hole being defined by a bottom wall and sidewalls, and said applying step comprises applying said composition to at least a portion of said bottom wall and sidewalls.

40. The method of claim 37, further including the step of baking said layer, after said applying step, at a temperature of from about 100–250° C. to yield a cured layer.

41. The method of claim 40, further including the step of applying a photoresist to said baked layer.

42. The method of claim 41, furthering including the steps of:
exposing at least a portion of said photoresist to activating radiation; and
developing said exposed photoresist.

43. The method of claim 42, wherein said developing step results in the removal of said composition from areas adjacent said exposed photoresist.

44. A method of forming an integrated circuit precursor structure, said method comprising the steps of:
forming a coating of a composition on a substrate, said composition comprising:
a solvent system; and
a polymer dispersed or dissolved in said solvent system, said polymer being formed by reacting a polymeric metal alkoxide with an organic compound, said polymeric metal alkoxide including recurring units having the formula

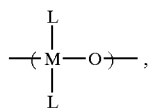

wherein M is a metal, and each L is individually selected from the group consisting of diketo and alkoxide ligands, and
said organic compound comprises a functional group for coordinating with M of said polymeric metal alkoxide;
applying a photoresist to said coating to form a photoresist layer on said coating; and
selectively removing portions of said photoresist layer and said coating to form a line feature on said substrate, wherein said line feature has an angle "a" of from about 83–90°.

45. The method of claim 44, wherein said substrate is selected from the group consisting of silicon wafers and ion implant layers.

46. The method of claim 44, wherein said removing step comprises removing said portions with an aqueous developer.

47. The method of claim 46, wherein said aqueous developer is selected from the group consisting of tetramethyl ammonium hydroxide and KOH developers.

48. A method of forming an integrated circuit precursor structure, said method comprising the steps of:
forming a coating of a composition on a substrate, said composition comprising:
a solvent system; and
a polymer dispersed or dissolved in said solvent system, said polymer including recurring units having the formula

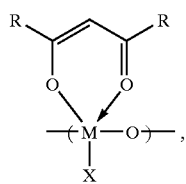

wherein X is a light-attenuating moiety, M is a metal, and each R is individually selected from the group consisting of hydrogen, alkyls, aryls, alkoxys, and phenoxys;
applying a photoresist to said coating to form a photoresist layer on said coating; and
selectively removing portions of said photoresist layer and said coating to form a line feature on said substrate, wherein said line feature has an angle "a" of from about 83–90°.

49. The method of claim 48, wherein said substrate is selected from the group consisting of silicon wafers and ion implant layers.

50. The method of claim 48, wherein said removing step comprises removing said portions with an aqueous developer.

51. The method of claim 50, wherein said aqueous developer is selected from the group consisting of tetramethyl ammonium hydroxide and KOH developers.

52. A method of forming an integrated circuit precursor structure, said method comprising the steps of:
forming a coating of a composition on a substrate, said composition comprising:
a solvent system; and
a polymer dispersed or dissolved in said solvent system, said polymer being formed by reacting a polymeric metal alkoxide with an organic compound, said polymeric metal alkoxide including recurring units having the formula

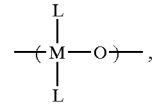

wherein M is a metal, and each L is individually selected from the group consisting of diketo and alkoxide ligands, and
said organic compound comprises a functional group for coordinating with M of said polymeric metal alkoxide;
applying a photoresist to said coating to form a photoresist layer on said coating; and
selectively removing portions of said photoresist layer and said coating to form a line feature on said substrate, wherein said line feature has a percent erosion of less than about 15%.

53. The method of claim 52, wherein said substrate is selected from the group consisting of silicon wafers and ion implant layers.

54. The method of claim 52, wherein said removing step comprises removing said portions with an aqueous developer.

55. The method of claim 54, wherein said aqueous developer is selected from the group consisting of tetramethyl ammonium hydroxide and KOH developers.

56. The method of claim 52, wherein said line feature has an angle "a" of from about 83–90°.

57. A method of forming an integrated circuit precursor structure, said method comprising the steps of:

forming a coating of a composition on a substrate, said composition comprising:
a solvent system; and
a polymer dispersed or dissolved in said solvent system, said polymer including recurring units having the formula

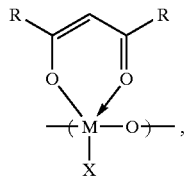

wherein X is a light-attenuating moiety, M is a metal, and each R is individually selected from the group consisting of hydrogen, alkyls, aryls, alkoxys, and phenoxys;

applying a photoresist to said coating to form a photoresist layer on said coating; and selectively removing portions of said photoresist layer and said coating to form a line feature on said substrate, wherein said line feature has a percent erosion of less than about 15%.

58. The method of claim 57, wherein said substrate is selected from the group consisting of silicon wafers and ion implant layers.

59. The method of claim 57, wherein said removing step comprises removing said portions with an aqueous developer.

60. The method of claim 59, wherein said aqueous developer is selected from the group consisting of tetramethyl ammonium hydroxide and KOH developers.

61. The method of claim 57, wherein said line feature has an angle "a" of from about 83–90°.

* * * * *